United States Patent [19]
Takanabe

[11] Patent Number: 5,277,579
[45] Date of Patent: Jan. 11, 1994

[54] WAFERS TRANSFERRING METHOD IN VERTICAL TYPE HEAT TREATMENT APPARATUS AND THE VERTICAL TYPE HEAT TREATMENT APPARATUS PROVIDED WITH A WAFERS TRANSFERRING SYSTEM

[75] Inventor: Eiichiro Takanabe, Kanagawa, Japan

[73] Assignee: Tokyo Electron Sagami Limited, Kanagawa, Japan

[21] Appl. No.: 847,303

[22] Filed: Mar. 6, 1992

[30] Foreign Application Priority Data

Mar. 15, 1991 [JP] Japan ................................ 3-105009
Mar. 26, 1991 [JP] Japan ................................ 3-87525

[51] Int. Cl.⁵ .............................................. F27D 3/12
[52] U.S. Cl. .......................................... 432/5; 432/6; 432/241
[58] Field of Search ................. 432/241, 5, 6, 11, 152, 432/253

[56] References Cited

U.S. PATENT DOCUMENTS

| | | | |
|---|---|---|---|
| 4,610,628 | 9/1986 | Mizushima | 432/241 |
| 4,828,490 | 5/1989 | Indig | 432/124 |
| 4,981,436 | 1/1991 | Watanabe | 432/241 |
| 5,055,036 | 10/1991 | Asano et al. | 432/241 |
| 5,131,842 | 7/1992 | Miyazaki et al. | 432/5 |

Primary Examiner—Henry C. Yuen
Attorney, Agent, or Firm—Oblon, Spivak, McClelland, Maier & Neustadt

[57] ABSTRACT

A wafers transferring method in the heat treatment apparatus of the vertical type comprising providing a boat loading/unloading chamber under a process tube, providing an elevator in the boat loading/unloading chamber, providing a wafer loading/unloading chamber communicated with the boat loading/unloading chamber, providing a robot in the wafer loading/unloading chamber, mounting a boat on the elevator, loading wafers one by one into the boat from the bottom to the top by the robot, while lowering the boat every pitch, heat-processing the wafers in the boat in the process tube, and unloading the wafers one by one from the boat from the top to the bottom by the robot, while lifting the boat every pitch.

7 Claims, 6 Drawing Sheets

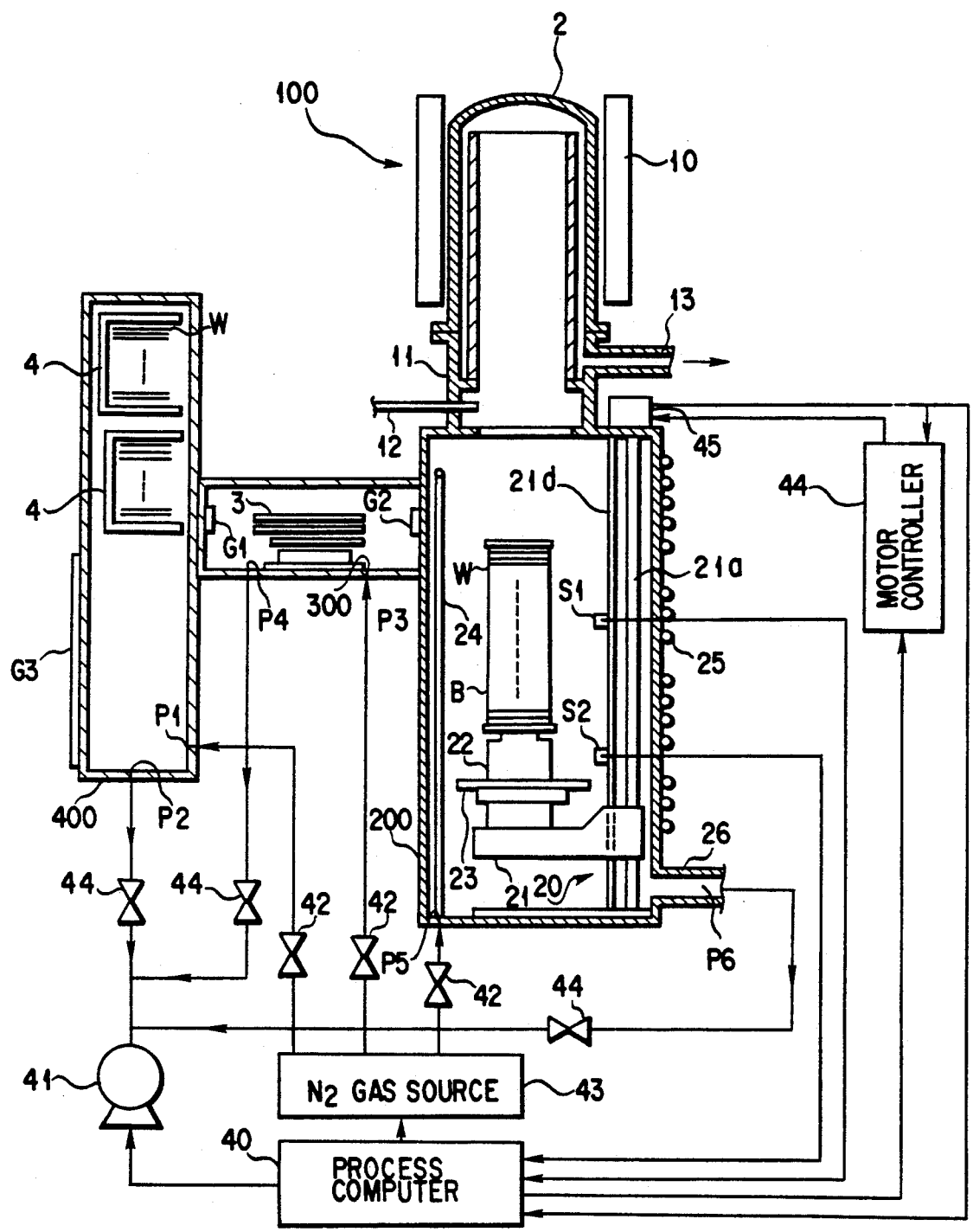
F I G. 1

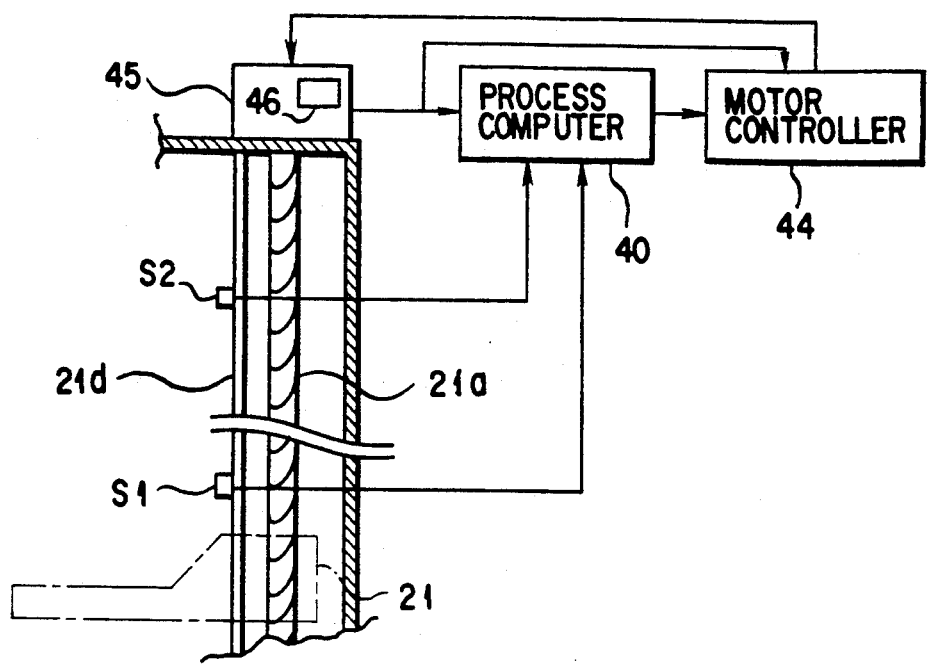
F I G. 4
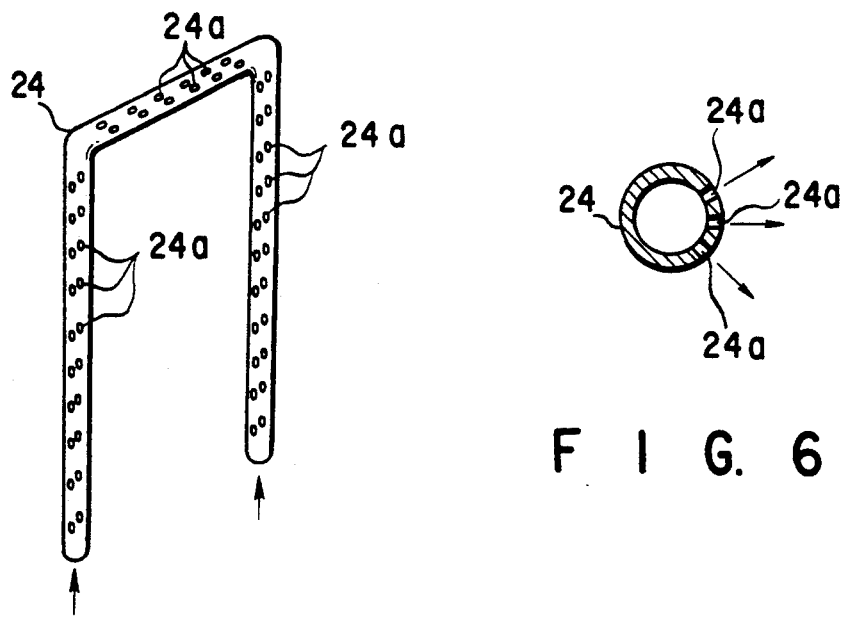
F I G. 5
F I G. 6

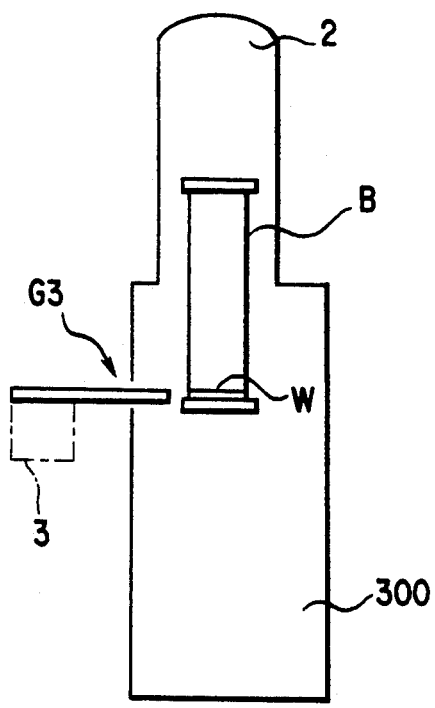
F I G. 9
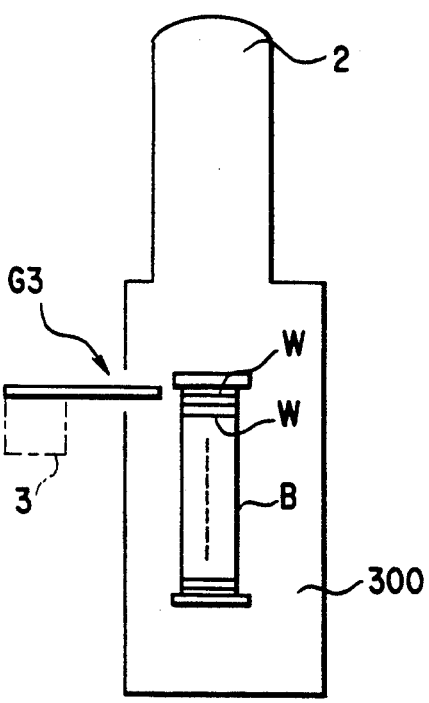
F I G. 10

WAFERS TRANSFERRING METHOD IN VERTICAL TYPE HEAT TREATMENT APPARATUS AND THE VERTICAL TYPE HEAT TREATMENT APPARATUS PROVIDED WITH A WAFERS TRANSFERRING SYSTEM

BACKGROUND OF THE INVENTION

1. Field of the Invention

The present invention relates to a method of transferring wafers into a boat and a heat treatment apparatus provided with a system for transferring the wafers into the boat. More particularly, it relates to a method and an apparatus for transferring semiconductor wafers into the boat in a boat loading/unloading section of the vertical type CVD apparatus.

2. Description of the Related Art

Semiconductor devices have been more and more highly integrated these days and the process of manufacturing the semiconductor devices is therefore asked to meet more requisites. Various heat treatment steps are included in the semiconductor devices manufacturing process and semiconductor wafers are heated and cooled at these heat processing steps.

Conventionally, those apparatuses in which the CVD film forming, diffusing and oxidizing processes were carried out were mainly of the horizontal type. In the case of the horizontal CVD apparatus, however, air is likely to be included in the process atmosphere at the boat loading time. Naturally-oxidized film is thus formed on each of the wafers to thereby reduce the productivity of the wafers.

The vertical CVD apparatus has been therefore used more and more to carry out the CVD film forming process. In the case of the vertical CVD apparatus, the wafer boat is loaded into and unloaded from the process tube through the bottom opening thereof and this makes it difficult to include air into the process atmosphere.

The vertical CVD apparatus of this type has a boat loading chamber under the process tube. The boat loading chamber (or lower chamber) is provided with an elevator system for moving the wafer boat up and down.

When the wafers are to be transferred from a cassette to the boat, it is needed that the adhering of particles to the wafers is prevented. It is therefore preferable that the wafers transferring operation is carried out in the lower chamber if possible.

When the wafers transferring system is to be housed in the lower chamber, however, the volume of the lower chamber must accordingly be made large. This takes a long time in purging the lower chamber with inactive gas. If the lower chamber is not fully purged with inactive gas, the wafers of high temperature unloaded into the lower chamber will be oxidized and naturally-oxidized film unnecessary for carrying out the film forming process will be formed on each of the wafers. Therefore, it is needed that the lower chamber is made as small as possible.

Further, when the wafers transferring system is housed in the lower chamber, it can be seriously deteriorated by heat radiated from the process tube, the boat and the wafers. It may be protected from this radiated heat by a cover member, but when covered by the cover member, it becomes large in size. It is therefore needed that the lower chamber is made large in size. This causes the loading and unloading of the wafers and the boat to take a long time.

SUMMARY OF THE INVENTION

An object of the present invention is therefore to provide a wafers transferring method capable of preventing the naturally-oxidized film from being formed on each of the wafers, also preventing the wafers from being contaminated by dust and particles, and quickly transferring the wafers between the boat and the cassette for a shorter time, and preventing variation of temperature of the wafer surface.

Another object of the present invention is to provide a heat treatment apparatus of the vertical type capable of reducing heat deterioration added to the wafers transferring system.

According to an aspect of the present invention, there can be provided a wafers transferring method in the vertical type heat treatment apparatus comprising providing a boat loading/unloading chamber under a process tube; providing a boat lifter means in the boat loading/unloading chamber; providing a wafer loading/unloading chamber communicated with the boat loading/unloading chamber; providing a robot means in the wafer loading/unloading chamber; mounting a boat on the boat lifter means; loading wafers one by one into the boat from the bottom of boat to the top of boat by the robot means, while lowering the boat every pitch; heat-treating the wafers in the boat in the process tube; and unloading the wafers one by one from the boat from the top to the bottom by the robot means, while lifting the boat every pitch.

According to another aspect of the present invention, there can be provided a vertical type heat treatment apparatus provided with a wafers transferring system comprising a boat loading/unloading chamber provided with a means for moving a boat up and down and located under a process tube; a wafer loading/unloading chamber provided with a wafer transferring robot means and communicated with the boat loading/unloading chamber; a means for controlling the boat lifter means in such a way that it can move up or down every pitch; and a means for supplying inactive gas into the boat loading/unloading chamber.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a vertically-sectioned view showing the main portion of the CVD apparatus of the vertical type according to an embodiment of the present invention;

FIG. 4 is a block diagram showing a drive control system for the boat lifter system;

FIG. 5 is a perspective view showing the gas jetting pipe;

FIG. 6 is a cross sectional view showing the gas jetting pipe;

FIG. 9 is a vertically-sectioned view showing the state of the boat at the time when the wafers loading is started; and FIG. 10 is a vertically-sectioned view showing the state of the boat at the time when the wafers loading is finished.

DETAILED DESCRIPTION OF THE PREFERRED EMBODIMENTS

Figure 2:
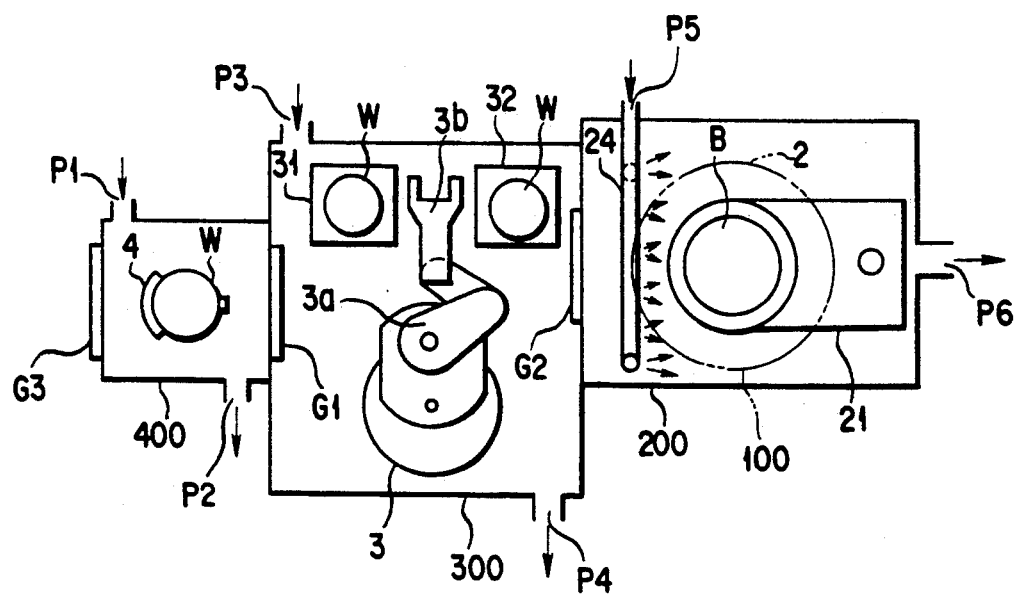
FIG. 2 is a plan view showing cassette, wafers transferring robot, and boat loading/unloading sections or chambers of the CVD apparatus.

An embodiment of the vertical type CVD apparatus will be described with reference to the accompanying drawings.

As shown in FIG. 1, a boat loading/unloading chamber (or lower chamber) 200 is located just under a heat process section 100. A robot chamber 300 is located next to the lower chamber 200. Further, a cassette chamber 400 is located next to the robot chamber 300.

A partition wall between the chambers 300 and 400 is provided with a gate G1 and another partition wall between the chambers 200 and 300 is provided with a gate G2. Each of the gates G1 and G2 is controlled to open and close by a controller (not shown) backed up by a computer system. The gate G1 is located in the center of that side of the cassette chamber 400 which is contacted with one side of the robot chamber 300. The gate G2 is located at the upper portion of that side of the lower chamber 200 which is contacted with the other side of the robot chamber 300.

As shown in FIG. 2, gas supply and exhaust pipes are communicated with each of the chambers 200, 300 and 400 so as to control its internal atmosphere independently of the others. More specifically, gas supply pipe P5 and exhaust pipe P6 are communicated with the chamber 200, gas supply pipe P3 and exhaust pipe P4 with the chamber 300, and gas supply pipe P1 and exhaust pipe P2 with the chamber 400. The gas supply pipes P1, P3 and P5 are communicated with a nitrogen gas supply source 43 via valves 42, and the gas exhaust pipes P2, P4 and P6 with a vacuum pump 41 via valves 44. The gas supply pipe P5 is further communicated with a gas jetting pipe 24 in the lower chamber 200.

The cassette chamber 400 is shaped like a vertically-elongated rectangle and it houses two cassette stages (not shown) therein. The two cassette stages are moved up and down in the cassette chamber 400 by an elevator system (not shown).

A quartz-made process tube 2 of the vertical type is provided at the heat process section 100. Heaters 10 enclose the process tube 2. A power source for the heaters 10 is connected to a controller (not shown) backed up by the computer system. The amount of current supplied to the heaters 10 is controlled by the controller, depending upon the kind of the heat process to be carried out. In short, the process tube 2 is heated to 500°-1000° C. when the CVD film forming process is to be carried and to 800°-1200° C. when the film oxidizing or diffusing process is to be carried out.

A manifold 11 is connected to the bottom of the process tube 2 and process gas is supplied into the process tube 2 through a gas supply pipe 12 of the manifold 11. Waste gas in the process tube 2 is exhausted outside the process tube 2 through an exhaust pipe 13 of the manifold 11.

A boat loading/unloading system 20 and the gas jetting pipe 24 are housed in the lower chamber 200. A water cooling pipe 25 encloses the lower chamber 200 to prevent the chamber 200 from being over-heated.

Figure 3:
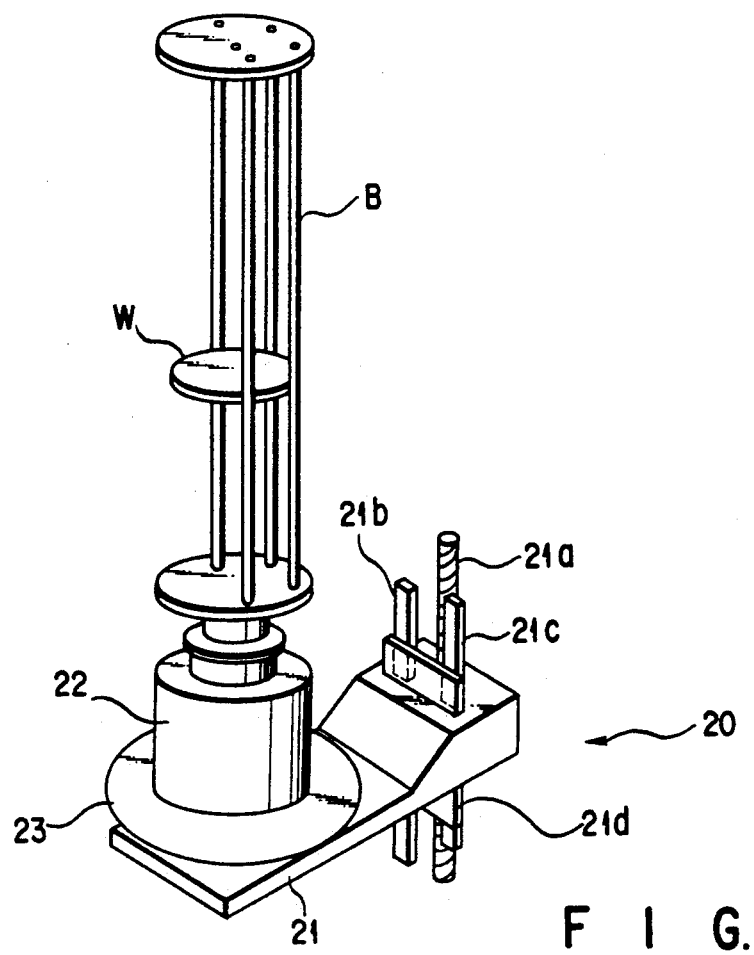
FIG. 3 is a perspective view showing a wafer boat and a boat lifter system.

As shown in FIG. 3, a wafer boat B is mounted on an elevator 21 of the boat loading/unloading system 20. The boat B will be able to load up to 99 sheets of silicon wafers W maximum. A heat insulating sleeve 22 and a flange 23 are interposed between the elevator 21 and the wafer boat B. A ball screw 21a is screwed into a nut section of the elevator 21. A pair of linear guides 21b, 21c and a heat shielding plate 21d pass through the elevator 21.

As shown in FIG. 4, the upper end portion of the ball screw 21a is connected to the drive shaft of a motor 45. An encoder 46 is incorporated into the motor 45 to generate pulses in response to the rotation of the ball screw 21a. The encoder 46 is connected to the input section of a process computer 40. Also connected to the input section of the process computer 40 are a pair of optical sensors S1 and S2 for detecting the wafers.

The paired sensors S1 and S2 are attached to the heat shielding plate 21d, having a pitch interval of 80 cm between them in the vertical direction. The heat shielding plate 21d is made of such material as stainless steel which has a small coefficient of thermal expansion. A cooling water path (not shown) is provided on the other face of the heat shielding plate 21d.

The encoder 46 is connected to an input section of a motor controller 44. The output section of the motor controller 44 is connected to the motor 45. Responsive to pulses applied from the encoder 46, the motor 45 is controlled by the controller 44 in such a way that the elevator 21 can be intermittently moved up and down only by a stroke which corresponds to the interval between the two adjacent wafers W in the boat B.

The motor 45 is also connected to the input section of the process computer 40. The process computer 40 sends command signals to the controller 44, responsive to outputs applied from the sensors S1 and S2. As a result, the rotation of the motor 45 is controlled to move the elevator 21 up and down by a pitch (which corresponds to the interval between the two adjacent wafers W in the cassette 4). The computer 40 also counts pulses applied from the encoder 46 while the elevator 21 is moved up or down between the sensors S1 and S2, and it displays the number of the pulses thus counted on a display (not shown).

This intermittent moving of the elevator 21 may be automatically controlled by a predetermined software or it may be manually operated by the operator, responsive to the number of the pulses counted.

It will be now described how the drive rotation of the motor 45 is corrected.

When the lower chamber 200 is at room temperature, that drive rotation number K of the motor 45 which corresponds to a reference stroke (or 800 mm, for example) of the elevator 21 moving between the sensors S1 and S2 is previously calculated. Because the drive rotation number K of the motor 45 corresponds to a number N1 of output pulses generated by the encoder 46, this output pulse number N1 of the encoder 46 comes to be calculated by the process computer 40 while moving the elevator 21 between the sensors S1 and S2. When the heat process is now to be carried out, that output pulse number N2 of the encoder 46 which corresponds this time to the reference stroke of the elevator 21 moving between the sensors S1 and S2 is similarly calculated. The output pulse number N2 is then compared with the number N1 previously obtained, thereby correcting the command of the motor controller 44. When N2 is smaller than N1, for example, it is believed that the ball screw 21a has been elongated. Therefore, the rotation number K of the motor 45 needed to move the elevator 21 by a predetermined distance is corrected by the process computer 40 so as to meet the elongation of the ball screw 21a. More concretely, the output pulse number N1 of the encoder 46 each pulse corresponding to a pitch between the two adjacent wafers W in the boat B is changed by the motor controller 44.

The robot chamber 300 will be described with reference to FIG. 2.

A transfer robot 3, a buffer stage 31 and a pre-alignment stage 32 are housed in the robot chamber 300. The base of the transfer robot 3 is mounted on an XYZθ-stage. A multi-joint arm 3a of the transfer robot 3 comprises expansible links. A wafer holder 3b is attached to the front of the multi-joint arm 3a. The wafer holder 3b is made of stainless steel and plural pins are erected on the upper surface of the wafer holder 3b. The plural pins are made of heat resistant resin durable even at a temperature range of 100°–150° C. The wafers W can be held one by one by this wafer holder 3b. The wafer holder 3b may be made double, triple or more to hold plural wafers at a time.

The buffer and pre-alignment stages 31 and 32 are located symmetrical, interposing the transfer robot 3 between them. The pre-alignment stage 32 is located adjacent to the gate G2 to align the orientation flat (or O.F.) of each of the wafers W in a desired direction. The buffer stage 31 is located adjacent to the gate G1 to make the wafer W, which has been transferred from the cassette chamber 400, ready for being held by the wafer holder 3b while the O.F. of the foregoing wafer W is being aligned at the stage 32.

The gas jetting pipe 24 in the lower chamber 200 will be described referring to FIGS. 5 and 6.

As shown in FIG. 5, the gas jetting pipe 24 is shaped like a reversed-U. Gas jetting holes 24a of the gas jetting pipe 24 are directed to the boat elevator 21.

As shown in FIG. 6, a cross-sectioned area of the gas jetting pipe 24 has three gas jetting holes 24a.

Figure 7:
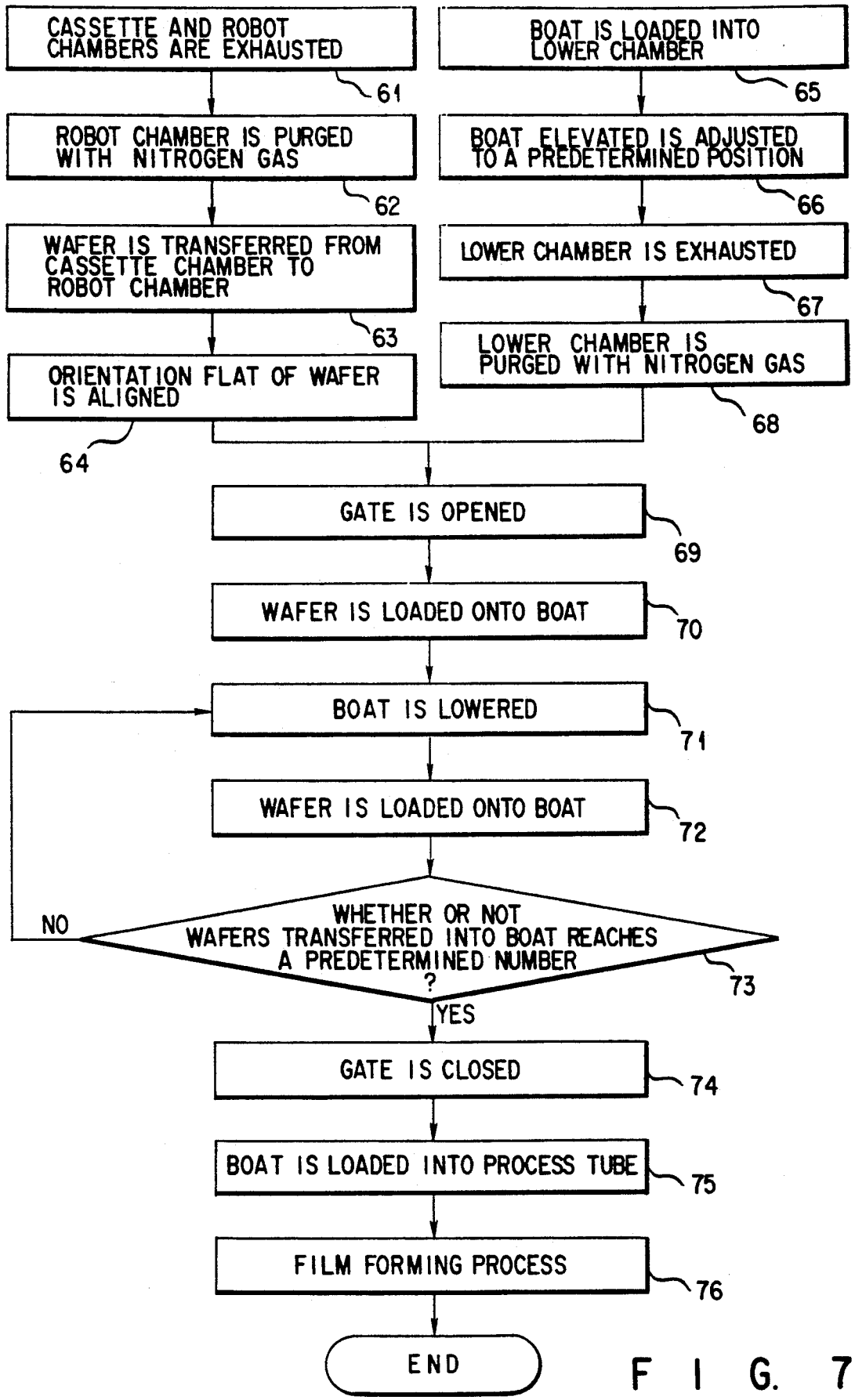
FIG. 7 is a flow chart showing a wafers loading process comprising transferring wafers from a cassette to a boat and loading the boat into the process tube.

Referring to FIG. 7, it will be now described how the wafers W are transferred from the cassette 4 to the boat B.

The gate G3 is opened and two cassettes 4 are carried into the cassette chamber 400. 25 sheets of 6-inch silicon wafers W are housed in each of the cassettes 4. The gate G3 is closed and the cassette chamber 400 is exhausted. The robot chamber 300 is also similarly exhausted at the same time (Step 61).

The gate G3 is closed and nitrogen gas is supplied to the cassette chamber 400 at a rate of several liters per minutes. The cassette chamber 400 is thus filled with nitrogen gas of atmospheric pressure.

The gate G1 is closed and nitrogen gas is supplied to the robot chamber 300 at a rate of several liters per minute. The robot chamber 300 is thus filled with nitrogen gas of atmospheric pressure (Step 62).

One of the cassettes 4 is faces the gate G1 while lifting the cassette stage. The gate G1 is opened and wafer W is carried from the cassette chamber 400 into the robot chamber 300 by the robot 3. The wafer W is mounted on the pre-alignment stage 32 (Step 63). The O.F. of the wafer W is aligned on the stage 32 while mounting a next second wafer W on the stage 31 (Step 64).

The following steps 65–68 will be carried out while conducting the steps 61–64.

The door (not shown) of the lower chamber 200 is opened. The boat B is carried into the lower chamber 200 and mounted on the elevator 21 (Step 65). The boat B is lifted by the elevator system 20 to position the lowermost wafer holding ring of the boat B just in front of the gate G2 (Step 66).

Air in the lower chamber 200 is exhausted outside through the exhaust pipe P6 (Step 67). Nitrogen gas is jetted into the lower chamber 200 through the gas jetting pipe 24 at a flow rate of several liters per minutes. The lower chamber 200 is thus filled with nitrogen gas (Step 68).

When the robot and lower chambers 300 and 200 are fully filled with nitrogen gas, the gate G2 is opened (Step 69). The internal pressure in each of the robot and lower chambers 300 and 200 is same this time as atmospheric pressure.

As shown in FIG. 9, a wafer W is transferred from the boat B to the lowermost ring of the boat B by the robot 3 (Step 70).

The boat B is lowered only by one pitch by the elevator system 20 (Step 71). A next wafer W is loaded onto the second holder ring of the boat B counted from below (Step 72). It is judged by the process computer 40 whether or not the number of the wafers W loaded into the boat B reaches a predetermined value (Step 73). When the judgement at this step 73 is "NO", the process is returned to the step 71, and the steps 71–73 are repeated until the number of the wafers W loaded into the boat B reaches the pre-determined value. As shown in FIGS. 9 and 10, the wafers W are successively loaded into the boat B from the bottom to the top while lowering step by step the boat B every pitch. When the wafers W are loaded into the boat B in such a way that they become remoter and remoter from the heat process section 100, heat influence relative to them can be kept small.

When the judgement at the step 73 is "YES", the process advances to a step 74 and the gate G2 is closed.

The process tube 2 in the heat process section 100 is heated by the heaters 10. After the process tube 2 is heated to a predetermined process temperature, the boat B is carried into the process tube 2 (Step 75).

Process gas is supplied into the process tube 2 while exhausting the process tube 2. Polysilicon film is thus formed on each of the wafers W (Step 76).

Figure 8:
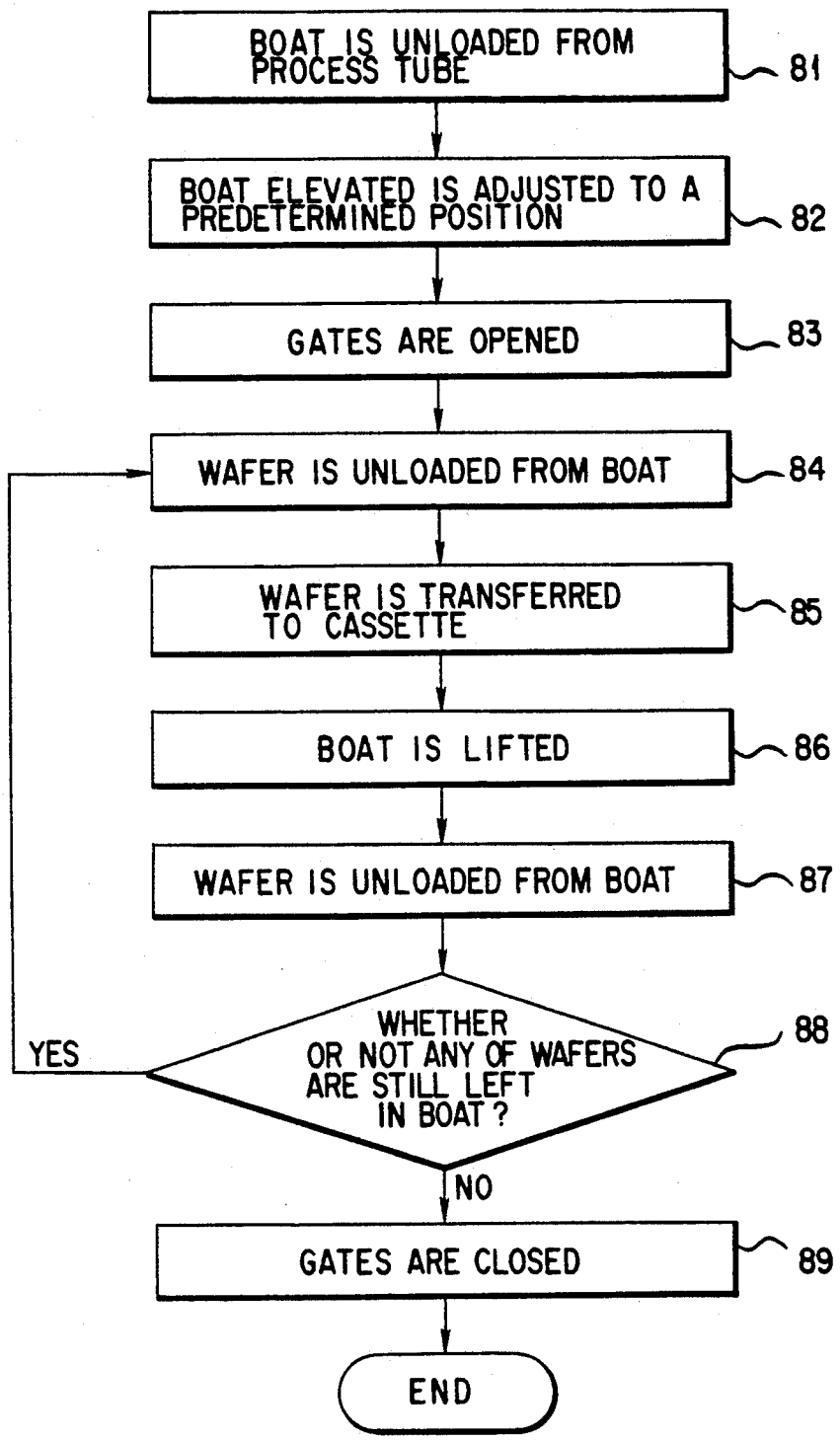
FIG. 8 is a flow chart showing wafers unloading process comprising unloading the boat from the process tube and transferring the wafers from the boat to the cassette.

Referring to FIG. 8, it will be described how the wafers W are transferred from the boat B to the cassette 4.

After the film forming process 76, the process tube 2 and the lower chamber 200 are filled with nitrogen gas. The boat B is unloaded from the process tube 2 (Step 81). Nitrogen gas is jetted to the boat B through the gas jetting pipe 24 to forcedly cool the wafers W in the boat B by gas thus jetted.

The boat B is lowered and adjusted by the elevator system 20 to come to a position where the most upper wafer W in the boat B is located at the elevation of the robot 3. Namely, the most upper wafer W in the boat B is positioned just in front of the gate G2, as shown in FIG. 10.

The wafers W in the boat B are cooled to a temperature low enough, say, a temperature lower than 100° C., for example, by gas cooling. Both of the gates G1 and G2 are then opened (Step 83). The robot and cassette chambers 300 and 400 are filled this time with nitrogen gas. The internal pressure in each of these robot and cassette chambers 300 and 400 is equal to atmospheric pressure.

The most upper wafer W in the boat B is taken out by the robot 3 (Step 84). While extending the multi-joint arm 3a, the wafer W is transferred to the cassette 4 in the cassette chamber 400 (Step 85).

The boat B is lifted only by one pitch (Step 86).

A second wafer W in the boat B counted from the top is picked up and transferred to the cassette 4 by the robot 3 (Step 87).

It is judged whether or not any of the wafers W is still left in the boat B (Step 88). When the judgement is "YES", the process is returned to the step 84 and steps 84–88 are repeated until no wafer is left in the boat B. While lifting the boat B every pitch as shown in FIGS. 9 and 10, the wafers W are unloaded from the boat B from the top to the bottom.

When the judgement is "NO", the process advances to step 89 and both of the gates B1 and G2 are closed. The cassette stage is lowered to position the cassette 4, which has been filled with the processed wafers W, just in front of the gate G3. The gate G3 is opened and the cassette 4 is carried outside from the cassette chamber 400.

Although the present invention has been described in a case where it is applied to the CVD film forming process, it can be applied to other heat processes such as film oxidizing and diffusing processes.

Although the wafers W have been loaded to and unloaded from the boat B while keeping the internal pressure in the lower chamber 200 equal to atmospheric pressure, they may be loaded and unloaded under the state that the internal pressure in the lower chamber 200 is lower than atmospheric pressure.

According to the above-described embodiment of the present invention, the loading of the wafer W is started from the bottom side of the boat B. The thermal influence of the heat process section 100 added to the wafer W which are not processed yet can be kept lowest. In addition, the unloading of the wafer W is started from the top side of the boat B. Therefore, the thermal influence of the heat process section 100, quite high in temperature, added to the processed wafers W in the boat b can also be kept lowest in this case. As a result, a change in the heat history of each of the wafers W can be made smaller and a more stable film forming process can be applied to the whole of the wafers W, thereby enhancing the quality of the products thus produced an also their productivity.

According to the above-described embodiment of the present invention, the transfer robot 3 is arranged in the chamber 300 independent of the lower chamber 200. The volume of the lower chamber 200 can be thus made smaller. This enables the lower chamber 200 to be exhausted and nitrogen-purged for a shorter time to increase the throughput of the apparatus. In addition, the robot 3 is not arranged in the high temperature section (or lower chamber). This can prevent the robot 3 from receiving heat radiated from the process section 100, thereby enabling the robot 3 to have a longer life.

Further, the transfer robot 3 is housed in the chamber 300 which can be locked. Therefore, dust and particles created by the robot 3 can be stopped from entering into the heat process section 100. This can prevent the wafers W in the film forming process from being contaminated by these particles and the process atmosphere in the heat process section 100 can be kept cleaner.

Merits of the present invention are as follows.

The heat history of each of the wafers W can be kept as previously expected to thereby enhance the quality of the processed wafers to a greater extent.

The chamber into and from which the boat B is loaded and unloaded can be made smaller. Atmosphere in the chamber can be thus more quickly controlled to make the productivity of the wafers higher. No naturally-oxidized film can be formed on any of the wafers in the boat loading/unloading chamber.

Particles created by the transfer robot can be prevented from entering into the process tube, so that the rate of wafers contaminated can be made smaller.

The transfer robot cannot be degraded by heat and therefore, the robot can have a longer life.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A wafer transferring method in a vertical type heat-treatment apparatus, comprising the steps of:
   providing a boat loading/unloading chamber under a process tube;
   preparing a boat lifter means for lifting a boat in the boat loading/unloading chamber;
   preparing a wafer loading/unloading chamber communicating with the boat loading/unloading chamber;
   preparing a robot means in the wafer loading/unloading chamber;
   mounting a boat on the boat lifter means;
   introducing a nitrogen gas into the boat loading/unloading chamber to set up a nitrogen gas pressure substantially equal to the atmospheric pressure within said chamber;
   loading wafers one by one into the boat from a lower portion of the boat to an upper portion of the boat by the robot means, while lowering the boat every pitch;
   heat-treating the wafers in the boat in the process tube;
   introducing a nitrogen gas into the boat loading/unloading chamber; and
   unloading the wafers one by one from the boat from the upper portion to the lower portion by the robot means, while lifting the boat every pitch.

2. The wafer transferring method according to claim 1, further comprising, the steps of, providing a cassette chamber communicated with the wafer loading/unloading chamber and taking out the wafer one by one from a cassette in the cassette chamber by the robot means.

3. The wafer transferring method according to claim 1, further comprising, the step of, pre-aligning the wafer in the wafer loading/unloading chamber and then carrying the wafer into the boat loading/unloading chamber.

4. The wafer transferring method according to claim 1, further comprising, the steps of, providing a gas jetting means in the boat loading/unloading chamber and blowing gas against the boat and the wafers through the gas jetting means to cool them.

5. The wafer transferring method according to claim 1, further comprising, the steps of, detecting the heat distortion of the boat lifter means and correcting the pitch movement of the boat lifter means on the basis of said detected heat distortion.

6. The wafer transferring method according to claim 1, wherein the wafer loading/unloading chamber is filled with nitrogen gas to have a pressure equal to atmospheric pressure, when the wafers are loaded into and unloaded from the boat.

7. The wafer transferring method according to claim 2, wherein the cassette chamber is filled with nitrogen gas to have a pressure equal to atmospheric pressure, when the wafers are loaded into and unloaded from the boat.

* * * * *